(12) United States Patent
Nakagawa et al.

(10) Patent No.: US 8,441,606 B2
(45) Date of Patent: May 14, 2013

(54) ELECTRO-OPTICAL DEVICE AND ELECTRONIC APPARATUS

(75) Inventors: Masashi Nakagawa, Chitose (JP);
Masahiro Yasukawa, Chino (JP);
Takunori Iki, Chitose (JP)

(73) Assignee: Seiko Epson Corporation, Tokyo (JP)

( * ) Notice: Subject to any disclaimer, the term of this patent is extended or adjusted under 35 U.S.C. 154(b) by 357 days.

(21) Appl. No.: 12/889,726

(22) Filed: Sep. 24, 2010

(65) Prior Publication Data

US 2011/0073868 A1    Mar. 31, 2011

(30) Foreign Application Priority Data

Sep. 29, 2009    (JP) .................................. 2009-225301

(51) Int. Cl.
*G02F 1/1343*    (2006.01)
(52) U.S. Cl.
USPC ............. 349/139; 349/143; 349/111; 349/38
(58) Field of Classification Search .................... 349/48, 349/43, 139, 143, 110, 111, 38, 39; 257/72, 257/E33.053

See application file for complete search history.

(56) References Cited

U.S. PATENT DOCUMENTS

| 6,232,947 | B1 | 5/2001 | Miyawaki et al. |
| 2005/0052340 | A1 | 3/2005 | Goto et al. |
| 2009/0040447 | A1* | 2/2009 | Nakagawa ............... 349/139 |

FOREIGN PATENT DOCUMENTS

| JP | 7-311387 A | 11/1995 |
| JP | 2005-156574 A | 6/2005 |

* cited by examiner

*Primary Examiner* — Thoi Duong
(74) *Attorney, Agent, or Firm* — ALG Intellectual Property, LLC

(57) ABSTRACT

An electro-optical device comprises: a first data line extending in a first direction; a second data line extending in the first direction and arranged so as to be at least partially overlapped with the first data line; a first scanning line and a second scanning line extending in a second direction intersecting the first direction; a first transistor electrically connected to the first data line and electrically connected to the first scanning line; a first pixel electrode electrically connected to the first transistor; a second transistor electrically connected to the second data line and electrically connected to the second scanning line; and a second pixel electrode electrically connected to the second transistor.

14 Claims, 9 Drawing Sheets

ELECTRO-OPTICAL DEVICE AND ELECTRONIC APPARATUS

BACKGROUND

1. Technical Field

The present invention relates to, for example, a technical field of an electro-optical device, such as a liquid crystal device, and an electronic apparatus including the electro-optical device, such as a liquid crystal projector.

2. Related Art

This type of electro-optical device has an active matrix driving configuration by including pixel electrodes and scanning lines, data lines and a pixel switching Thin Film Transistor (TFT) for selectively driving the pixel electrodes on a substrate. In the active matrix driving, scanning signals are supplied from the scanning lines so as to control the operations of the pixel switching TFTs, and image signals are supplied to the data lines at timings when the TFTs are turned on and driven so as to realize an image display.

For example, JP-A-2005-156574 discloses technology for improving the resolution of a displayed image by assembling two display panels in a liquid crystal display device. In addition, JP-A-7-311387 discloses technology for displaying a high-resolution image by supplying different image signals to respective pixels corresponding to odd-numbered rows and even-numbered rows of the scanning lines.

However, in the technology disclosed in JP-A-2005-156574, since the two display panels need to be assembled, the internal structure of the device becomes complicated or the size of the device is increased. In the technology disclosed in JP-A-7-311387, the scanning lines of the odd-numbered rows and the even-numbered rows are independently controlled, but, from the instantaneous viewpoint, only writing to pixels on a single scanning line is performed. Since the number of pixels and the scanning speed (in other words, the driving frequency) is increased in order to increase the resolution, the writing time of an image signal to each pixel may not be shortened.

SUMMARY

An advantage of some aspects of the invention is that it provides an electro-optical device capable of displaying a high-resolution image while ensuring the writing time of an image signal to each pixel, and an electronic apparatus including the electro-optical device.

According to an aspect of the invention, there is provided an electro-optical device including, on a substrate, lower layer side data lines extending in a first direction; upper layer side data lines extending on an upper layer side of the lower layer side data lines in the first direction and arranged so as to be at least partially superposed on the lower layer side data lines in plan view on the substrate; first and second scanning lines extending in a second direction intersecting the first direction; first transistors provided in correspondence with intersections of the lower side data lines and the first scanning lines, and each including a first semiconductor layer having a first source region electrically connected to each of the lower layer side data lines, a first channel region, and a first drain region, and a first gate electrode arranged so as to face the first channel region and electrically connected to each of the first scanning lines; a first pixel electrode electrically connected to the first drain region; second transistors provided in correspondence with intersections of the upper layer side data lines and the second scanning lines, and each including a second semiconductor layer having a second source region electrically connected to each of the upper layer side data lines, a second channel region, and a second drain region, and a second gate electrode arranged so as to face the second channel region and electrically connected to each of the second scanning lines; and a second pixel electrode electrically connected to the second drain region.

In the electro-optical device of the invention, for example, wirings such as scanning lines and data lines or electronic elements such as pixel switching transistors are laminated on the substrate as necessary so as to be insulated from each other with an insulating film interposed therebetween such that circuits for driving pixel electrodes are configured and image electrodes are arranged on an upper layer side thereof. At the time of the operation of the electro-optical device, for example, the switching operations of the pixel switching TFTs electrically connected to the pixel electrodes are controlled through the scanning lines and image signals are supplied through the data lines such that voltages according to the image signals are applied to the pixel electrodes through the TFT. Accordingly, it is possible to realize an image display in a display region (also called "image display region") in which the plurality of pixel electrodes are arranged. In addition, the display region may be called "pixel region" or "pixel array region".

In the invention, in particular, the data lines for supplying the image signals to the pixels include the lower layer side data lines and the upper layer side data lines. Here, both the lower layer side data lines and the upper layer side data lines extend in the first direction, and the upper layer side data lines are arranged so as to be at least partially superposed on the lower layer side data lines in plan view on the substrate. Such data lines may be completely superposed on each other or may be slightly deviated from each other. Alternatively, the contour of one data line may be at least partially larger or smaller than the contour of the other data line. Since the conductive layer of the data line or the like is generally formed of a non-transparent material such as aluminum, a non-opening region in which display light is not transmitted or reflected may be partially configured in most cases. In the invention, by arranging the lower layer side data lines and the upper layer side data lines so as to be superposed on each other, it is possible to reduce a ratio of the non-opening region occupied in the image display region so as to improve an aperture ratio (that is, a ratio of an opening region occupied in the image display region (a ratio of a region, in which display light can be transmitted, occupied in the image display region)). As a result, it is possible to display a bright sharp image.

The first transistor of the invention is arranged on the intersection of the lower layer side data lines and the first scanning line and includes the first semiconductor layer and the first gate electrode. The first semiconductor layer includes the first source region, the first channel region and the first drain region, and the first gate electrode is arranged so as to face the first channel region. The first transistor may have a double gate structure.

In the invention, in particular, the first source region is electrically connected to the lower layer side data lines. Accordingly, the image signal applied to the lower layer side data lines is supplied to the first transistor. The upper layer side data lines are not electrically connected to the first transistor.

The first scanning line is electrically connected to the first gate electrode and ON/OFF of the first transistor can be adequately switched and controlled according to the supply timing of the scanning signal. In detail, the first transistor is turned on and driven at the timing when the scanning signal of a high level is supplied, and the image signal applied from the lower layer side data lines to the first source region is output from the first drain region.

The first drain region is electrically connected to the first pixel electrode. The image signal output from the first drain region is applied to the first pixel electrode by turning on and driving the first transistor at the timing when the scanning signal is supplied to the first gate electrode.

The second transistor of the invention is arranged on the intersection of the upper layer side data lines and the second scanning line and includes the second semiconductor layer and the second gate electrode. The second semiconductor layer includes the second source region, the second channel region and the second drain region, and the second gate electrode is arranged so as to face the second channel region. The second transistor may have a double gate structure.

In the invention, in particular, the second source region is electrically connected to the upper layer side data lines. Accordingly, the image signal applied to the upper layer side data lines is supplied to the second transistor. The lower layer side data lines are not electrically connected to the second transistor.

The second scanning line is electrically connected to the second gate electrode and ON/OFF of the second transistor can be adequately switched and controlled according to the supply timing of the scanning signal. In detail, the second transistor is turned on and driven at the timing when the scanning signal of a high level is supplied, and the image signal applied from the upper layer side to the second source region is output from the second drain region.

The second drain region is electrically connected to the second pixel electrode. The image signal output from the second drain region is applied to the second pixel electrode by turning on and driving the second transistor at the timing when the scanning signal is supplied to the second gate electrode.

Although the first gate electrode and the second gate electrode are electrically connected to the first scanning line and the second scanning line, respectively, in particular, if the first gate electrode and the second gate electrode are electrically connected to one first scanning line and second scanning line, respectively, the ON/OFF of the plurality of first transistors and second transistors arranged in the image display region may be simultaneously switched. In this case, it is possible to simultaneously write different image signals to the pixels configuring one pixel array.

By arranging the first and second transistors in which both the first and second scanning lines extending in the second direction are electrically connected to the respective gate electrodes, the plurality of pixels is configured in the image display region. The image signals are supplied to a series of pixels having the above configuration through the two data lines (that is, the upper side and lower side data lines).

As described above, since the lower layer side data lines and the upper layer side data lines are electrically connected to the first source region and the second source region, it is possible to simultaneously supply different image signals. Accordingly, the pixels corresponding to the first transistor and the second transistor can simultaneously display images based on different image signals. As a result, even when the number of pixels in the image display region is increased, since different image signals can be simultaneously supplied to the plurality of pixels the writing time per individual pixel is not shortened or it is possible to reduce the amount shortened to a minimum. As a result, it is possible to realize an electro-optical device capable of displaying an image with high resolution.

In the electro-optical device of the invention, the first and second scanning lines may be adjacent to each other.

The second transistor is arranged in correspondence with the second pixel adjacent to the first pixel, which is the pixel corresponding to the first transistor, in the first direction or the second direction in plan view on the substrate. As a result, since different image signals can be simultaneously supplied to the plurality of adjacent pixels, it is possible to improve the resolution of the display image.

The electro-optical device may further include a shield layer arranged between the plurality of lower layer side data lines and the plurality of upper layer side data lines and held at a predetermined potential.

Since the lower layer side data lines and the upper layer side data lines are independently formed, different image signals are basically applied. Accordingly, if the shield layer is not present, coupling is generated by an electric field generated based on a potential difference between the lower layer side data lines and the upper layer side data lines, and the image signals applied to the lower layer side data lines and the upper layer side data lines are mutually influenced and disturbed. In this aspect, by forming the shield layer held at the predetermined potential between the lower layer side data lines and the upper layer side data lines, it is possible to block the electric field generated between the lower layer side data lines and the upper layer side data lines and to efficiently suppress coupling. In addition, the predetermined potential may be a fixed potential such as a ground potential or a potential of a constant potential power source or a rectangular-wave potential such as a potential of a counter electrode. As a result, it is possible to suppress coupling between the lower layer side data lines and the upper layer side data lines and to realize an electro-optical device capable of displaying a high-quality image.

The shield layer may be formed at least partially wider than the plurality of lower layer side data lines and the plurality of upper layer side data lines in plan view on the substrate.

In this aspect, by forming the shield layer with a large width, it is possible to more efficiently prevent coupling between the lower layer side data lines and the upper layer side data lines. The electric field generated between the lower layer side data lines and the upper layer side data lines is prone to generate a horizontal component, in particular, in the vicinity of the ends of the lower layer side data lines and the upper layer side data lines. Since such a horizontal electric field component comes around the outside of the shield layer if the shield layer is not formed with a sufficiently large width, it is difficult to sufficiently suppress coupling between the lower layer side data lines and the upper layer side data lines. In this aspect, the shield layer is formed wider than the lower layer side data line and the upper layer side data line such that an electric field coming around the outside of the shield layer is sufficiently reduced. As a result, it is possible to suppress coupling between the lower layer side data lines and the upper layer side data lines with more certainty and to realize a higher quality of the display image.

If the effect of the shield layer can be sufficiently obtained, the shield layer may be formed with a small width. In this case, since the opening region of the pixel is not narrowed by the shield layer, it is possible to improve a degree of freedom in design.

The electro-optical device may further include conductive layers arranged on an upper layer side of the lower layer side data lines, and each of the conductive layers may be electrically connected to the first source region through a first contact hole and may be electrically connected to each of the lower layer side data lines through a second contact hole such that the first source region is electrically connected to each of the lower layer side data lines.

In this aspect, when the first source region is electrically connected to the lower layer side data lines, the conductive layer formed on the upper layer side of the lower layer side data lines is interposed. At this time, the conductive layer and the first source region are electrically connected through the first contact hole and the conductive layer and the lower layer side data lines are electrically connected through the second contact hole.

Here, since the upper layer side data lines are formed on the upper layer side of the lower layer side data lines, the distance between the upper layer side data lines and the second source region is prone to be greater than the distance between the lower layer side data lines and the first source region. That is, the electric resistance value between the upper layer side data lines and the second source region is prone to be longer than the electric resistance value between the lower layer side data lines and the first source region. If the electric resistance values of the path for applying the image signals are different, a difference in supply timing or amplitude of the image signal between the first transistor and the second transistor occurs.

In this aspect, by electrically connecting the first source region and the lower layer side data lines through the conductive layer (by intentionally setting the distance between the first source region and the lower layer side data lines to be large), the electric resistance value between the first source region and the lower layer side data lines can be approximated to the electric resistance value between the second source region and the upper layer side data lines. As a result, it is possible to reduce the difference in supply timing or amplitude of the image signal between the first transistor and the second transistor and to make the display characteristics of the image of the first pixel and the second pixel uniform.

In the aspect in which the above-described relay layer is included, the first contact hole may include a plurality of contact holes, and the plurality of contact holes may be at least partially superposed on each other in plan view on the substrate.

In this aspect, the first contact hole formed when the lower layer side data lines are electrically connected to the first source region includes the plurality of contact holes and the plurality of contact holes is arranged so as to be at least partially superposed on each other. Here, the contact hole is buried by a conductive material, but, in most cases, the conductive material is, for example, a non-transparent metal such as aluminum. In this case, since the contact hole filled with the non-transparent material does not transmit light, a non-opening region in which display light is not transmitted may be partially configured in the image display region. Accordingly, if the plurality of contact holes is formed so as not to be superposed on each other, the area of the non-opening area is increased and thus an aperture ratio of the image display region is lowered. In this case, by arranging the plurality of formed contact holes to be superposed on each other, it is possible to markedly reduce the area of the non-opening region and to improve the aperture ratio of the image display region. As a result, it is possible to realize an electro-optical device capable of displaying a bright sharp image.

In the electro-optical device of the invention, each of the upper layer side data lines and the second source region may be electrically connected through a plurality of contact holes, and the plurality of contact holes may be at least partially superposed on each other in plan view on the substrate.

In this aspect, the plurality of contact holes formed when the upper layer side data lines are electrically connected to the second source region is arranged so as to be at least partially superposed on each other. By arranging the plurality of contact holes as described above, similarly to the above-described aspect, it is possible to markedly reduce the area of the non-opening region and to improve the aperture ratio of the image display region. As a result, it is possible to realize an electro-optical device capable of displaying a bright sharp image.

Although the upper layer side data lines and the second source region may be connected through a single contact hole, practically, it is difficult to secure good conductivity by the single contact hole when another component needs to be formed between the upper layer side data line and the second source region or when the film thickness of the insulating layer formed between the layers is thick. Accordingly, in most cases, the plurality of contact holes needs to be formed.

In the electro-optical device of the invention, the first pixel electrode and the first drain region, and the second pixel electrode and the second drain region may be electrically connected through a plurality of contact holes, and the plurality of contact holes may be arranged so as to be at least partially superposed on each other in plan view on the substrate.

In this aspect, the plurality of contact holes formed when the first pixel electrode and the first drain region, and the second pixel electrode and the second drain region are electrically connected is arranged so as to be at least partially superposed on each other. By arranging the plurality of contact holes as described above, similarly to the above-described aspect, it is possible to markedly reduce the area of the non-opening region and to improve the aperture ratio of the image display region. As a result, it is possible to realize an electro-optical device capable of displaying a bright sharp image.

The electro-optical device of the invention may further include a first capacitive electrode formed on a lower layer side of the first pixel electrode with a first capacitive insulating film interposed therebetween and a second capacitive electrode formed on a lower layer side of the second pixel electrode with a second capacitive insulating film interposed therebetween.

In this aspect, since each of the first transistor and the second transistor has the storage capacitor, it is possible to improve the storage characteristics (that is, characteristics in which the pixel electrodes store the supplied image signals). Although the storage capacitor is formed by interposing the capacitive insulating film between two capacitive electrodes, in this aspect, in particular, one capacitive electrode is configured to become the pixel electrode. That is, by interposing the first capacitive insulating film and the second capacitive insulating film between the first capacitive electrode and the second capacitive electrode, the first pixel electrode and the second pixel electrode form storage capacitors. By using the pixel electrode as one electrode forming the storage capacitor, it is possible to suppress complication of the lamination structure on the substrate and to provide the storage capacitor with an efficient layout.

In this case, the first capacitive insulating film and the second capacitive insulating film may be simultaneously formed from the same insulating film and the first capacitive electrode and the second capacitive electrode may be simultaneously formed from the same conductive film.

According to this aspect, since the capacitive insulating films and the capacitive electrodes among the components of the storage capacitors formed in the first transistor and the second transistor are respectively formed from the same films, it is possible to simplify the lamination structure on the substrate. As a result, it is possible to easily realize simplification or high accuracy of the process of manufacturing the electro-optical device.

According to another aspect of the invention, there is provided an electronic apparatus including the above-described electro-optical device (including the various aspects).

According to the electronic apparatus of the invention, since the above-described electro-optical device of the invention is included, it is possible to realize various electronic apparatuses capable of performing a high-quality image display, such as a projection type display device, a television set, a cellular phone, an electronic organizer, a word processor, a viewfinder-type or direct-view monitor type video tape recorder, a workstation, a videophone, a POS terminal, a touch-panel-equipped device. As the electronic apparatus of the invention, for example, it is possible to realize an electrophoretic device such as electronic paper, an electronic emission device (Field Emission Display and conduction Electron-Emitter Display), and a display device using the electrophoretic device and the electronic emission device.

The operation and the other advantages of the invention will be apparent from the following modes.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described with reference to the drawings. In the following embodiments, for example, a TFT active matrix driving type liquid crystal device, in which a driving circuit is built, will be described as an example of an electro-optical device of the invention.

Liquid Crystal Device

First Embodiment

First, the overall configuration of a liquid crystal device according to the present embodiment will be described with reference to FIGS. 1 and 2.

Figure 1:
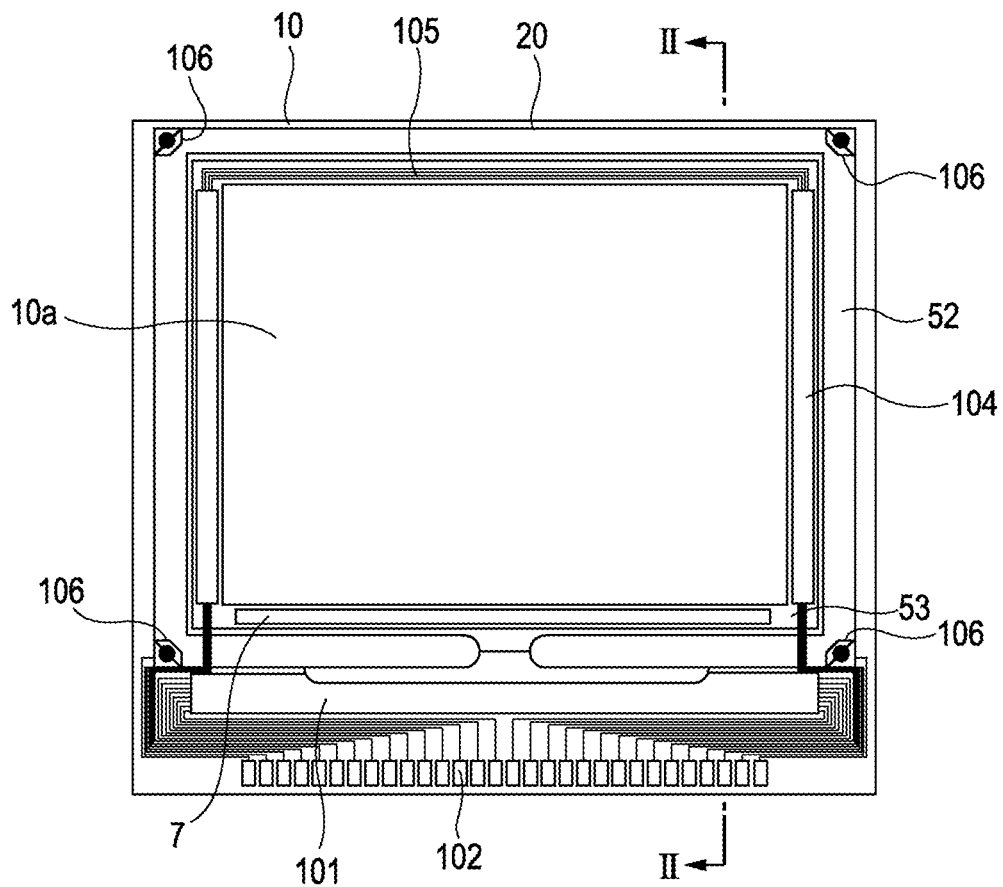
FIG. 1 is a plan view showing the overall configuration of a liquid crystal device according to a first embodiment of the invention.
Figure 2:
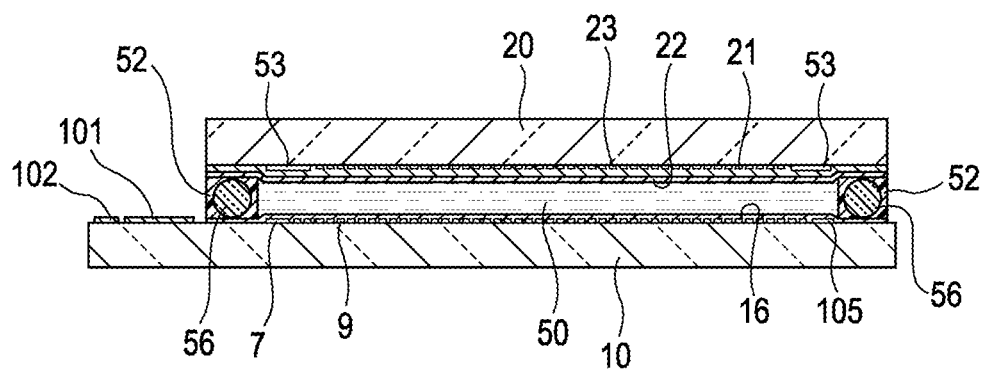
FIG. 2 is a cross-sectional view taken along line II-II of FIG. 1.

FIG. 1 is a schematic plan view showing components formed on a TFT array substrate 10 and the configuration of the liquid crystal device when viewed from the side of a counter substrate 20 and FIG. 2 is a cross-sectional view taken along line II-II of FIG. 1.

In FIGS. 1 and 2, the liquid crystal device according to the present embodiment includes the TFT array substrate 10 and the counter substrate 20 which face each other. The TFT array substrate 10 is, for example, a transparent substrate such as a quartz substrate or a glass substrate. The counter substrate 20 is also, for example, a substrate formed of the same material as the TFT array substrate 10. A liquid crystal layer 50 is sealed between the TFT array substrate 10 and the counter substrate 20, and the TFT array substrate 10 and the counter substrate 20 are adhered by a sealing material 52 provided on the circumference of an image display region 10a in which an electro-optical operation is performed.

The sealing material 52 is used to adhere both substrates, is formed of ultraviolet curable resin or thermoset resin, is applied on the TFT array substrate 10 in a manufacturing process and is cured by ultraviolet ray irradiation, heating, or the like. In addition, for example, in the sealing material 52, gap materials 56 for maintaining a gap between the TFT array substrate 10 and the counter substrate 20 (a gap between the substrates), such as glass fiber or glass beads, are dispersed.

On the inside of the sealing material 52, in parallel to the sealing material, a light-shielding frame light-shielding film 53 defining a frame region of the image display region 10a is provided on the side of the counter substrate 20. A portion or the whole of the frame light-shielding film 53 may be provided on the side of the TFT array substrate 10 as a built-in light-shielding film.

A demultiplexer 7, scanning line driving circuits 104, an external circuit connection terminal 102 and the like are formed on the circumference of the image display region 10a on the TFT array substrate 10.

On the inside of the sealing material 52 on the TFT array substrate 10 in plan view, the demultiplexer 7 is placed along one side of the image display region 10a along one side of the TFT array substrate 10 so as to cover the frame light-shielding film 53.

The scanning line driving circuits 104 are provided along two sides adjacent to one side of the TFT array substrate 10 so as to cover the frame light-shielding film 53. In order to electrically connect the two scanning line driving circuits 104 provided on both sides of the image display region 10a, a plurality of wirings 105 is provided along the remaining side of the TFT array substrate 10 so as to cover the frame light-shielding film 53.

Vertical conductor terminals 106 are placed on the TFT array substrate 10 in regions facing four corners of the counter substrate 20 in plan view, and vertical conductor materials are electrically connected to the terminals 106 between the TFT array substrate 10 and the counter substrate 20 in correspondence with the vertical conductor terminals 106.

In FIG. 2, a lamination structure including the pixel switching TFTs or the wirings such as the scanning lines and the data lines are formed on the TFT array substrate 10. In the image display region 10a, pixel electrodes 9 are provided in a matrix on an upper layer side of the pixel switching TFTs or the wirings such as the scanning lines and the data lines. In the present embodiment, in particular, the pixel electrodes 9 are formed as transparent electrodes formed of an ITO film. An alignment film 16 is formed on the pixel electrodes 9.

A light-shielding film 23 is formed on a surface of the counter substrate 20 opposed to the TFT array substrate 10. The light-shielding film 23 is formed of, for example, a metal film, resin, or the like having a light-shielding property and is patterned in, for example, a lattice shape in the image display region 10a on the counter substrate 20. A counter electrode 21 formed of an ITO film is, for example, solidly formed on the light-shielding film 23 (on the lower side of the light-shielding film 23 in FIG. 2) so as to face the plurality of pixel electrodes 9, and an alignment film 22 is formed on the counter electrode 21 (on the lower side of the counter electrode 21 in FIG. 2).

The liquid crystal layer 50 is formed of, for example, liquid crystal in which one type or various types of nematic liquid crystal is mixed, and is in a predetermined alignment state between a pair of alignment films (that is, the alignment films 16 and 22). By applying voltages at the time of the driving of the liquid crystal device, a liquid crystal retention capacity is formed between the pixel electrodes 9 and the counter electrode 21.

Although not shown herein, on the TFT array substrate 10, a precharge circuit for supplying a precharge signal having a predetermined voltage level to the plurality of data lines prior to the image signals, an inspection circuit or the like for inspecting the quality, defect or the like of the liquid crystal device during manufacture or before shipment may be formed.

Figure 3:
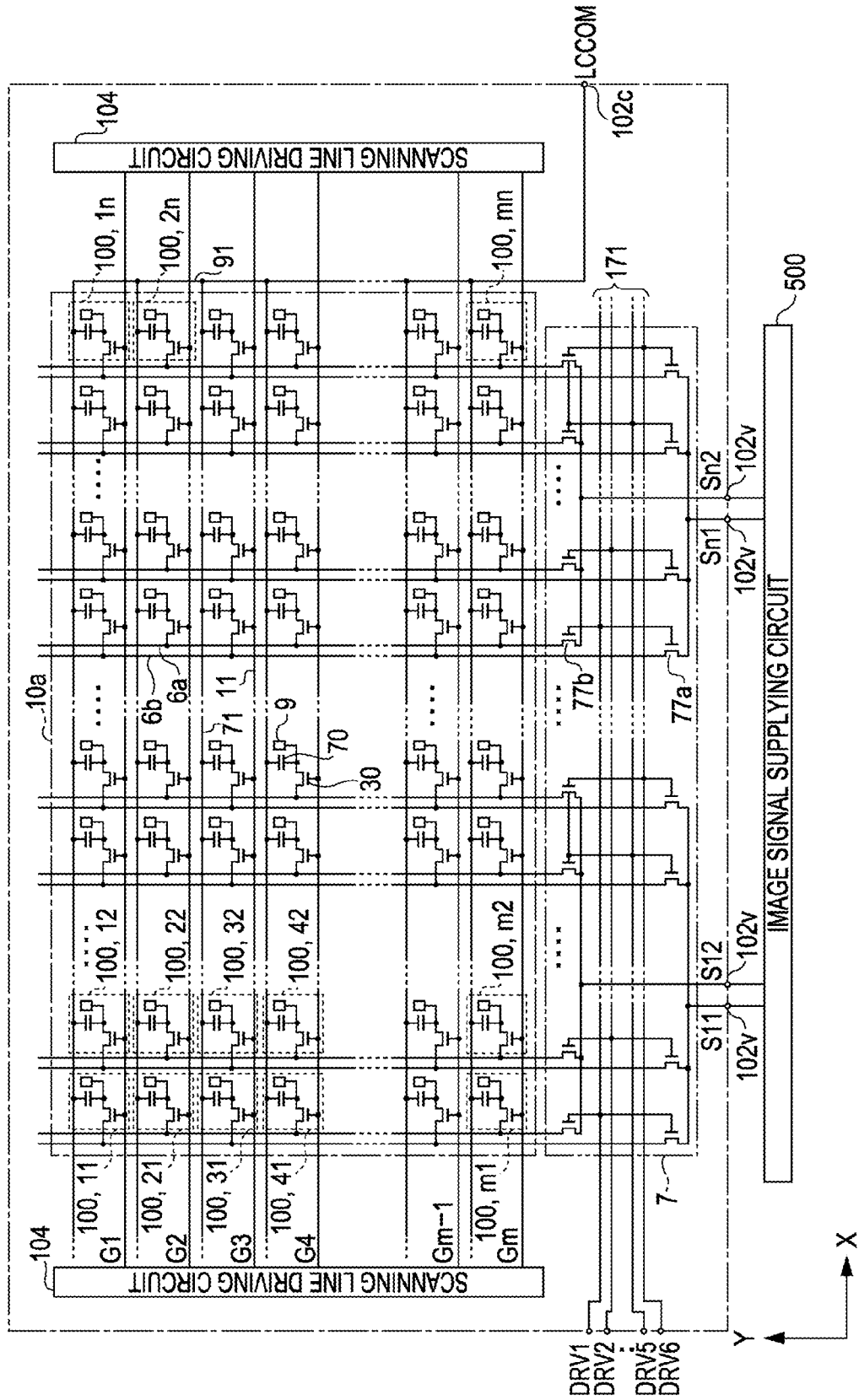
FIG. 3 is an equivalent circuit diagram showing the electrical configuration of the liquid crystal device according to the first embodiment of the invention.

Next, the electrical configuration of the liquid crystal device according to the present embodiment will be described with reference to FIG. 3. FIG. 3 is an equivalent circuit diagram showing the electrical configuration of the liquid crystal device according to the present embodiment.

In FIG. 3, the electro-optical device 100 includes the demultiplexer 7, the scanning line driving circuits 104 and driving signal lines 171 formed on the TFT array substrate 10. An image signal supplying circuit 500 as an external circuit is electrically connected to an image signal terminal 102v of external circuit connection terminals 102 on the TFT array substrate 10.

Each of the scanning line driving circuits 104 has a shift register and supplies to a scanning signal Gi (i=1, . . . , m) to a scanning line 11a. In detail, each of the scanning line driving circuits 104 selects m scanning lines 11 in predetermined order described below, sets the scanning signal to the selected scanning line 11 to a H level corresponding to a selection voltage, and sets the scanning signals to the other scanning lines to an L level corresponding to a non-selection voltage.

The image signal supplying circuit 500 is configured separately with the TFT array substrate 10 and is electrically connected to the TFT array substrate 10 through the image signal terminal 102v at the time of a display operation. The image signal supplying circuit 500 outputs an image signal having a voltage according to the grayscale of the pixel electrode 9 to the pixel electrode 9 corresponding to the scanning line 11 selected by the scanning line driving circuit 104 and the data line 6 selected by the demultiplexer 7.

In the image display region 10a, the data lines 6 are formed so as to extend along a Y direction. Here, the data lines 6 include n (n is a natural number of 2 or more) upper layer side data lines 6a and lower layer side data lines 6b. The upper layer side data lines 6a are placed on the TFT array substrate 10 in plan view so as to be superposed on the lower layer side data lines 6b. In the following description, "data lines 6" indicates both the upper layer side data line 6a and the lower layer side data lines 6b.

An image data signal Sij is supplied from the image signal supplying circuit 500 to the data lines 6 through the demultiplexer 7. Here, the demultiplexer 7 includes a plurality of transistors 77. Each of the transistors 77 includes an upper layer side transistor 77a corresponding to the upper layer side data lines 6a and a lower layer side transistor 77b corresponding to the lower layer side data lines 6b.

The driving signal lines 171 are connected to the gate electrodes of the transistors 77 so as to drive the transistors 77 at timings based on driving signals DRV supplied from the driving signal lines 171.

The gate electrodes of a pair of transistors 77 connected to a pair of data lines 6 (that is, the upper layer side data lines 6a and the lower layer side data lines 6b) superposed when viewed on the TFT array substrate 10 in plan view are electrically connected to one common driving signal line 171. Accordingly, the pair of transistors is driven at the same timing.

Six driving signal lines 171 are connected to the gate electrodes of six pairs of transistors 77, respectively. For example, the driving signals are sequentially supplied from the upper side of the 6 driving signal lines 171 so as to sequentially drive the 6 pairs of transistors 77 by pair.

The image data signals Sij respectively corresponding to the upper layer side data lines 6a and the lower layer side data lines 6b are supplied from the image signal supplying circuit 500 in synchronization with timings when the transistors 77 are driven. In detail, the image data signal Si1 corresponding to the upper layer side data lines 6a and the image data signal Si2 corresponding to the lower layer sides data line 6b, which are different from each other, are supplied from the image signal supplying circuit 500 to the pixels connected to the upper layer side data lines 6a and the lower layer side data lines 6b, respectively.

From the scanning line driving circuit 104, m (m is a natural integer of 2 or more) scanning lines 11 extend along an X direction. Each of the scanning lines 11 is electrically connected to the gate electrodes of the TFTs 30 so as to the drive the TFTs 30 placed on the scanning lines 11 based on a supply timing of the scanning signal. The source regions of the TFTs 30 each having the gate electrode connected onto the odd-numbered scanning lines 11 are electrically connected to the upper layer data lines 6a. The source regions of the TFTs 30 each having the gate electrode connected onto the even-numbered scanning lines 11 are electrically connected to the lower layer side data lines 6b.

In the image display region 10a, the pixels are arranged in a matrix in correspondence with intersections of the data lines 6 and the scanning lines 11. One pixel includes the pixel electrode 9 (see FIG. 2) forming a liquid crystal element with the counter electrode 20 and the liquid crystal 50 interposed therebetween, the pixel switching TFT 30 and a storage capacitor 70.

The gate electrode of the TFT 30 is electrically connected to the scanning lines 11 such that the switching of the TFT 30 is controlled according to the scanning signal. When the TFT 30 is turned on and driven, the image data signal Sij supplied to the source region electrically connected to the data lines 6 is supplied from the drain region of the TFT 30 to the pixel electrode 9.

One electrode configuring the storage capacitor 70 is electrically connected to a common potential line 91. The common potential line 91 extends to a peripheral region so as to be connected to a connection terminal 102c. The connection terminal 102c is a portion of the external connection terminal 102 (see FIG. 1). In addition, the connection terminal 102c is held at an LCCOM voltage by a power supply circuit which is built in an external device connected to the external connection terminal 102 so as to output the LCCOM voltage.

Although, in the present embodiment, the image signal supplying circuit 500 is connected to the portion 102v of the external connection terminal 102 as the external circuit so as to input the image data signal, the data signal supplying circuit for outputting the image data signal may be formed on the TFT array substrate 10. That is, the image signal supplying circuit 500 may be assembled in the liquid crystal device as the data signal supplying circuit.

Figure 4A:
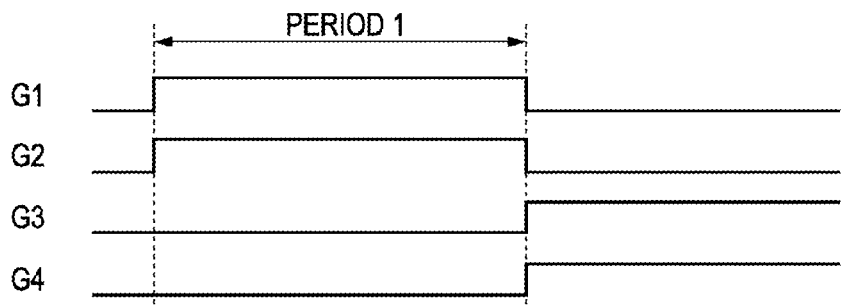
FIGS. 4A to 4C are timing charts illustrating input/output timings of various control signals input to or output from the inside of the liquid crystal device according to the first embodiment of the invention.
Figure 4B:
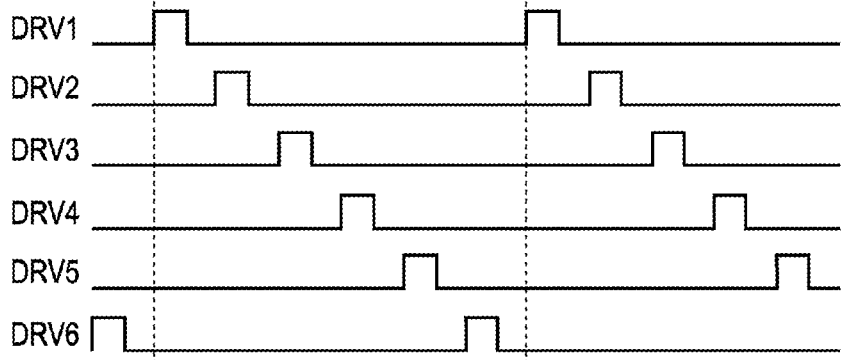
Figure 4C:
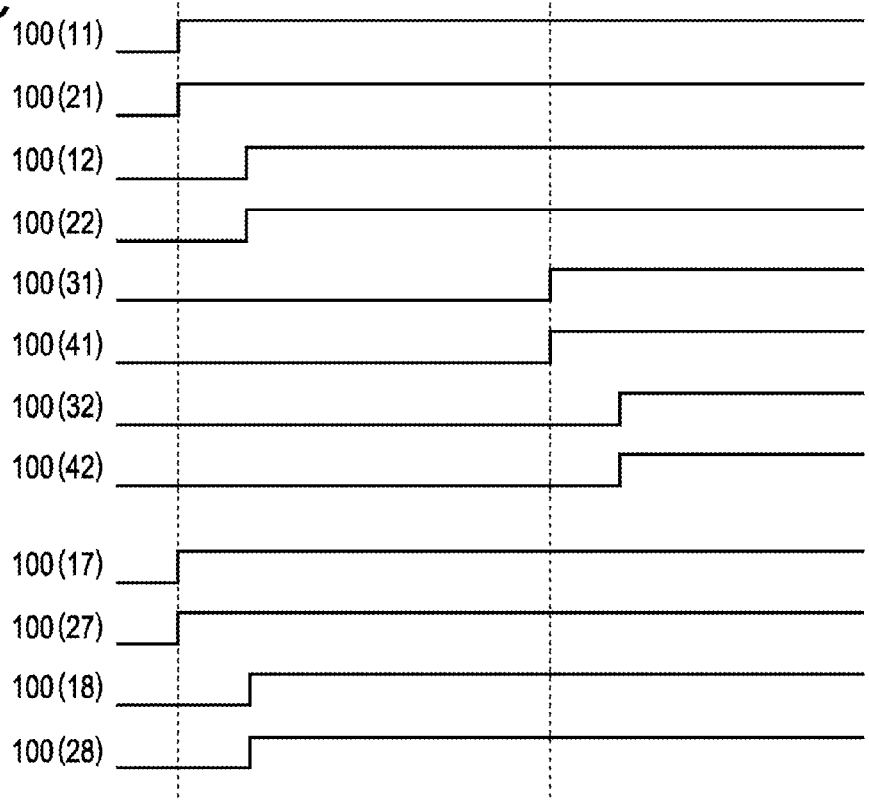

Now, various control signals input to or output from the inside of the liquid crystal device according to the present embodiment will be described in detail with reference to FIG. 4A to 4C in addition to FIG. 3. FIGS. 4A to 4C are timing charts illustrating input/output timings of various control signals input to or output from the inside of the liquid crystal device according to the first embodiment of the invention.

First, the supply timing of the scanning signal Gm supplied from the scanning line driving circuit 104 to the pixels through the scanning lines 11 will be described with reference to FIG. 4A.

Among the m scanning lines 11, the scanning signal Gm is supplied to two neighboring scanning lines 11 at the same timing. That is, the pixels placed on the two continuous scanning lines 11 are driven at the same time. In detail, the scanning signals G1 and G2, G3 and G4, . . . , Gm-1 and Gm are applied from the scanning lines 11 in this order at predetermined timings in a pulsed manner.

Next, the timings when the driving signals DRV are supplied from the driving signal lines 171 to the transistors 77 of the demultiplexer 7 and the potential written to the pixels arranged in the image display region will be described with reference to FIGS. 4B and 4C.

While the scanning signals G1 and G2 are supplied to the scanning lines 11 (see a period 1 in FIGS. 4A to 4C), the driving signals DRV1, DRV2, . . . , DRV6 are supplied to six driving signal lines 171 in this order.

As shown in FIG. 3, when the driving signal DRV 1 is supplied, the transistors 77 corresponding to the pixels 100 (11) and 100 (21) are driven such that the pixels 100 (11) and 100 (21) reach a writable state. Simultaneously, since the driving signal DRV1 is supplied to the transistors 77 corresponding to the pixels belonging to another data line group, such as the pixel 100 (17) and 100 (27), these pixels reach a writable state.

Subsequently, when the driving signal DRV2 is supplied, the transistors 77 corresponding to the pixels 100 (12) and 100 (22) are driven such that the pixels 100 (12) and 100 (22) reach a writable state. Simultaneously, since the driving signal DRV2 is supplied to the transistors 77 corresponding to the pixels belonging to another data line group, such as the pixel 100 (18) and 100 (28), these pixels reach a writable state. The image data signal Sij supplied from the data line driving circuit is applied to the pixels in the writable state. By this operation, when the writing is finished with respect to all the pixels of the image display region 10a, the above operation is repeated and a display image is updated in every field. The image data signal Sij written to the pixels is held until writing is performed in a next field.

Next, the lamination structure formed on the TFT array substrate 10 in the image display region 10a of the liquid crystal device according to the present embodiment will be described in detail with reference to FIGS. 5 to 7.

Figure 5:
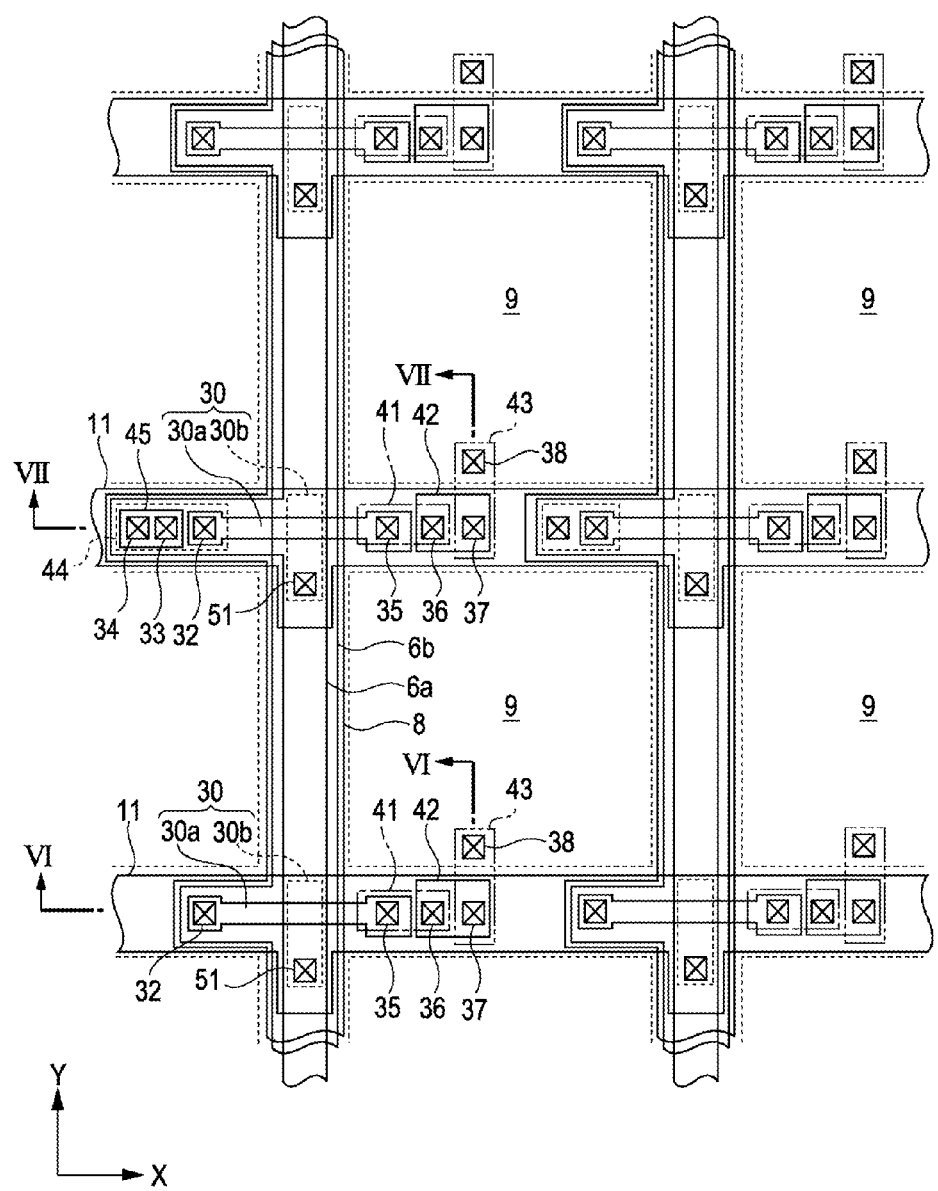
FIG. 5 is a schematic diagram perspectively showing a positional relationship between electrodes and wirings placed for performing an electro-optical operation in an image display region of the liquid crystal device according to the first embodiment of the invention.

FIG. 5 is a schematic diagram perspectively showing a positional relationship between electrodes and wirings placed for performing an electro-optical operation in the image display region 10a of the liquid crystal device according to the present invention. FIGS. 6 and 7 are cross-sectional views taken along line VI-VI and VII-VII of FIG. 5. In FIGS. 5 to 7, the scale of each layer or each member is differentiated from each other in order that each layer or each element has a size capable of being identified in the view. In order to facilitate the understanding of the shown contents, a portion of the structure shown in FIGS. 5 to 7 is partially omitted.

Figure 6:
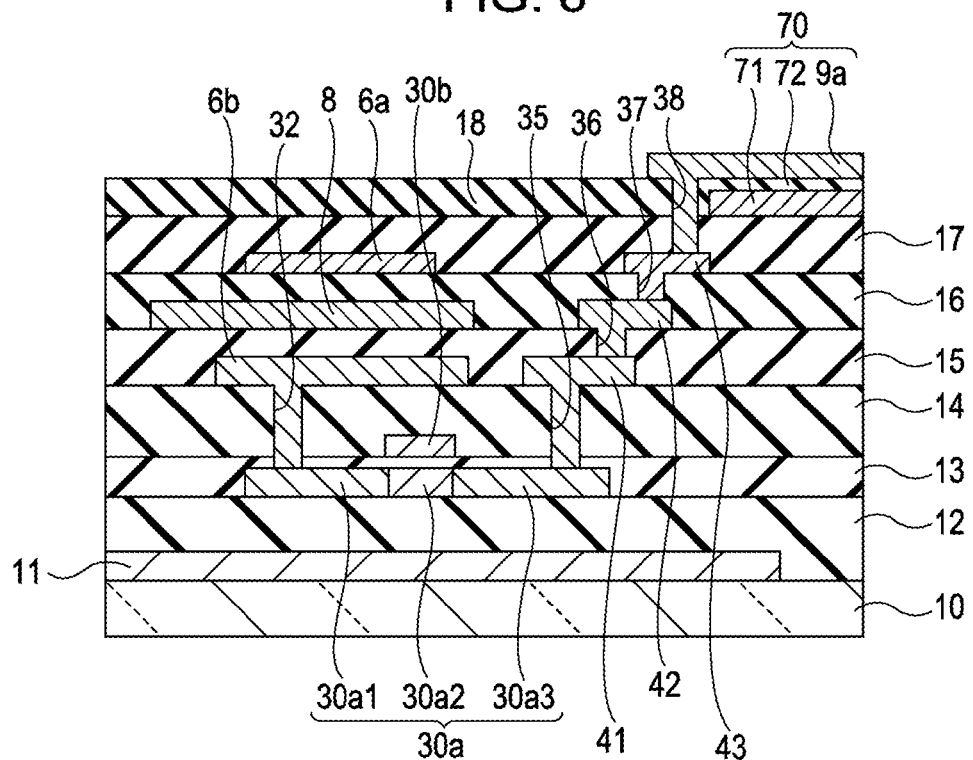
FIG. 6 is a cross-sectional view taken along line VI-VI of FIG. 5.
Figure 7:
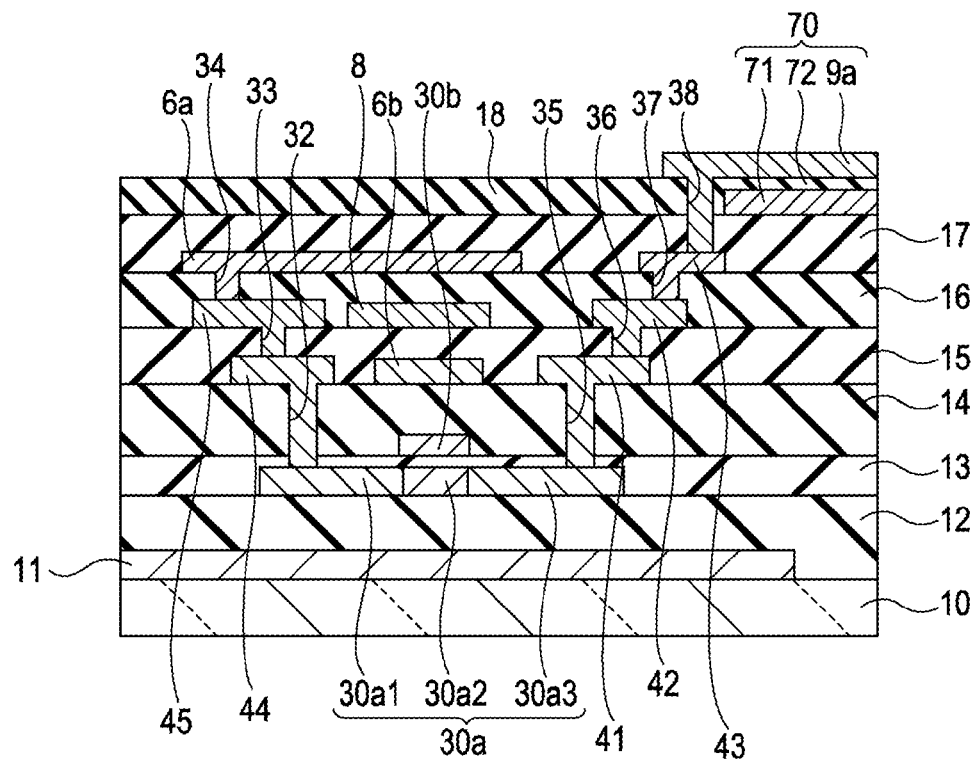
FIG. 7 is a cross-sectional view taken along line VII-VII of FIG. 5.

In supplementary description, FIG. 6 is a cross-sectional view showing a lamination structure of the pixels (that is, the pixels in which the TFT 30 is connected to the lower layer side data lines 6b) corresponding to the odd-numbered scanning lines 11 of the m scanning lines 11 in FIG. 3. FIG. 7 is a cross-sectional view showing a lamination structure of the pixels (that is, the pixels in which the TFT 30 is connected to the upper layer side data lines 6a) corresponding to the even-numbered scanning lines 11 of the m scanning lines 11 in FIG. 3.

First, the lamination structure of the pixels corresponding to the odd-numbered scanning lines 11 of the m scanning lines 11 will be described with reference to FIGS. 5 and 6.

The scanning lines 11 are formed on the TFT array substrate 10. Here, the scanning lines 11 are formed on the TFT array substrate 10 so as to extend in the X direction in plan view. The scanning lines 11 are formed of a light-shielding conductive material, for example, tungsten (W), titanium (Ti), titanium nitride (TiN) or the like and shield light incident from the rear side (that is, a lower side of FIG. 5) of the TFT array substrate 10 so as to prevent the wirings, the elements or the like formed on the upper layer side of the scanning lines 11 from being exposed to light. In the present embodiment, in particular, in order to suppress generation of leaked current and deterioration in the retention characteristics of the TFTs due to exposure of the semiconductor layer of the TFT 30 to light, the scanning lines 11 are formed on the TFT array substrate 10 wider than a region, in which the TFT 30 is formed, in plan view. By widely forming the scanning lines 11, the semiconductor layers of the TFTs may be mostly or completely shielded from returning light such as light emitted from another liquid crystal device and transmitted through a synthetic optical system in rear surface reflection of the TFT array substrate 10, a double plate type projector, or the like. As a result, at the time of the operation of the liquid crystal device, generated light leak current is reduced and a contrast ratio of a display image is improved so as to realize a high-quality image display.

The TFT 30 is formed on the upper layer side of the scanning lines 11 with a first interlayer insulating film 12 interposed therebetween. The TFT 30 is arranged on the TFT array substrate 10 in every pixel so as to correspond to the intersection of the scanning lines 11 formed so as to extend in the X direction and the data lines 6 formed so as to extend in the Y direction in plan view.

The TFT 30 includes a semiconductor layer 30a and a gate electrode 30b formed on an upper layer side thereof with a gate insulating film 13 interposed therebetween. Here, the semiconductor layer 30a includes a source region 30a1, a channel region 30a2 and a drain region 30a3 (see FIG. 6). A Lightly Doped Drain (LDD) region is formed in an interface of the channel region 30a2 and the source region 30a1 or the channel region 30a2 and the drain region 30a3.

The gate electrode 30b is formed on the upper layer side of the semiconductor layer 30a so as to face the channel region 30a2 with the gate insulating film 13 interposed therebetween. The gate electrode 30b is electrically connected to the scanning lines 11 through a contact hole 51 formed in the interlayer insulating film 12 and the gate insulating film 13 (see FIG. 5).

The source region 30a1 is electrically connected to the lower layer side data lines 6b formed on the upper layer side of the source region 30a through a contact hole 32 formed in the gate insulating film 13 and the second interlayer insulating film 14. The lower layer side data lines 6b are formed of a light-shielding conductive material, for example, aluminum (Al), and shields light incident from the upper side (that is, an upper side of FIG. 5) of the TFT array substrate 10 so as to prevent the wirings, the elements or the like formed on the lower layer side of the lower layer side data lines 6b from being exposed to light. As a result, the TFT 30 may be mostly or completely shielded from returning light such as light emitted from another liquid crystal device and transmitted through a synthetic optical system in rear surface reflection of the TFT array substrate 10, a double plate type projector, or the like. Thus, it is possible to realize a high-quality image display.

The drain region 30a3 is electrically connected to a first relay layer 41 through a contact hole 35 formed in the gate insulating film 13 and the second interlayer insulating film 14. Here, the first relay layer 41 is formed on the same layer as the lower layer side data lines 6b. The first relay layer 41 is formed of the same material as the lower layer side data lines 6b and is, for example, formed on the same layer as the lower layer side data lines 6b simultaneously with the lower layer side data lines by patterning a conductive layer solidly formed on the second interlayer insulating layer 14.

A second relay layer 42 is formed on the upper layer side of the first relay layer 7 and is electrically connected to the first relay layer 41 through a contact hole 36 formed in a third interlayer insulating film 15.

A third relay layer 43 is formed on the upper layer side of the second relay layer 42 and is electrically connected to the second relay layer 42 through a contact hole 37 formed in a fourth interlayer insulating film 16.

The pixel electrode 9 is formed on the upper layer side of the third relay layer 43 and is electrically connected to the third relay layer 43 through a contact hole 38 formed in a fifth interlayer insulating film 17 and a sixth interlayer insulating film 18. The pixel electrode 9 is electrically connected to the drain region 30a3 of the TFT 30 through the first relay layer 41, the second relay layer 42 and the third relay layer 43. As a result, the image signal is supplied to the pixel electrode 9 at a timing when the TFT 30 is turned on and driven.

A capacitive electrode 71 is formed on a lower layer side of the pixel electrode 9 with a capacitive insulating film 72. That is, the capacitive insulating film 72 is interposed between the pixel electrode 9 and the capacitive electrode 71 so as to form the storage capacitor 70.

In the present embodiment, in particular, both the pixel electrode 9 and the capacitive electrode 71 are formed of Indium Tin Oxide ITO). Since ITO is a transparent conductive material, the capacitive electrode can be widely formed in an opening region and the storage capacitor 70 having a large capacitive value can be formed.

Figure 8:
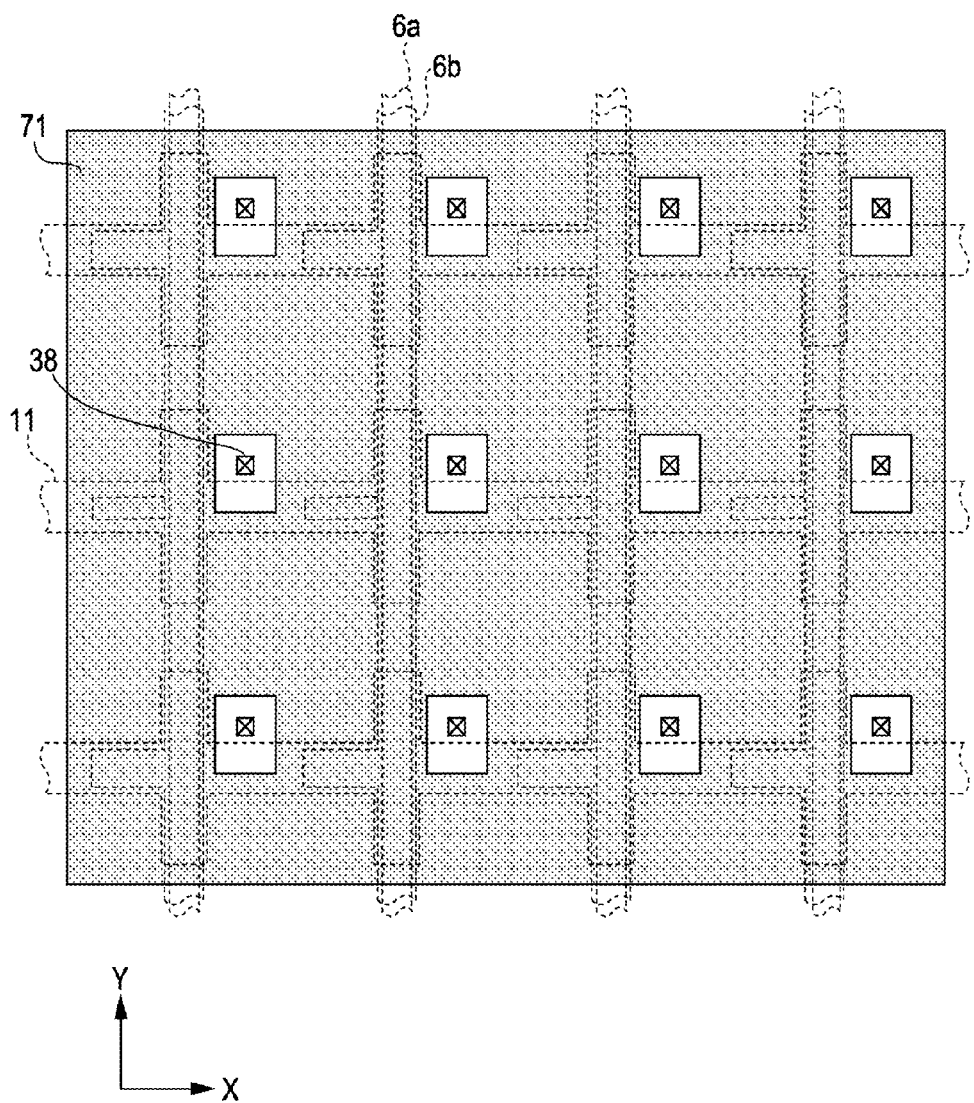
FIG. 8 is a schematic plan view showing a region, in which a capacitive electrode is disposed, on a TFT array substrate of the liquid crystal device according to the first embodiment, together with data lines and scanning lines.

FIG. 8 is a schematic diagram showing the region in which the capacitive electrode 71 is placed on the TFT array substrate 10 together with the data lines 6 and the scanning lines 11. In FIG. 8, for convenience of description, the data lines 6 and the scanning lines 11 formed on the lower layer side of the capacitive electrode 71 are perspectively shown, and the scale of each layer or each member is differentiated from each other in order that each layer or each member has a size capable of being identified in the view.

The data lines 6 and the scanning lines 11 extend in the Y direction and the X direction, respectively. The pixels are divided by the data lines 6 and the scanning lines 11. The capacitive electrode 71 has an opening region 5a in each pixel and the opening region 5a is formed such that the contact hole 38 is positioned therein. Since the opening region 5a is formed wider than the contact hole 38, although the pixel electrode 9 and the third relay layer 43 are electrically connected through the contact hole 38, the pixel electrode 9 and the third relay layer 43 can be safely connected with the capacitive electrode 71 without short-circuiting.

As described above, since the capacitive electrode 71 is formed of ITO which is the transparent conductive material, as shown in FIG. 8, the capacitive electrode can be formed over the wide range of the image display region. As a result, the storage capacitor 70 having the large capacitive value can be formed and the retention characteristics of the pixel can be improved.

In the present embodiment, since the data lines 6 are doubly formed, the lamination structure in the vicinity of the TFT array substrate 10 may become complicated. In this case, by forming the storage capacitor 70 on the pixel electrode side having a relatively simple lamination structure, it is possible to easily add the storage capacitor 70. In particular, by using the pixel electrode as one electrode configuring the storage capacitor, it is possible to efficiently suppress the complication of the lamination structure.

A shield layer 8 is formed on the upper layer side of the lower layer side data lines 6b with the third interlayer insulating film 15 interposed therebetween. The shield layer 8 is formed so as to suppress or prevent the lower layer side data line 6b from being coupled with the upper layer side data lines 6a formed on the upper layer side of the shield layer 8 with the fourth interlayer insulating film 16 (that is, disturbance of the image signal applied by an electric field generated by an electric potential difference between the upper layer side data lines 6a and the lower layer side data lines 6b) interposed therebetween.

As shown in FIG. 5, the shield layer 8 is formed wider than the data lines 6 in a non-opening region excluding the intersection of the data lines 6 and the scanning line 11. Since the electric field generated between the upper layer side data lines 6a and the lower layer side data lines 6b has more or less a component of a surface direction parallel to the TFT array substrate 10, a portion thereof comes around the end of the shield layer 8. Even in this case, by forming the shield layer 8 so as to be sufficiently larger than the upper layer side data lines 6a and the lower layer side data lines 6b, it is possible to efficiently reduce the electric field coming around the end.

The upper layer side data lines 6a are not electrically connected to the pixel corresponding to the odd-numbered scanning lines 11 of the m scanning lines 11.

Subsequently, the lamination structure of the pixel corresponding to the even-numbered scanning lines 11 of the m scanning lines 11 will be described with reference to FIGS. 5 and 7. The description of the common wirings, the elements and the like as the lamination structure of the pixel corresponding to the odd-numbered scanning lines 11 of the m scanning lines 11 will be appropriately omitted and are denoted by the same reference numerals.

The source region 30a1 is electrically connected to a fourth relay layer 44 formed on the upper layer side of the source region 30a through a contact hole 32 formed in the gate insulating film 13 and the second interlayer insulating film 14. The fourth relay layer 44 is electrically connected to a fifth relay layer 45 formed on the upper layer side of the third interlayer insulating film 15 through a contact hole 33. The fifth relay layer 45 is electrically connected to the upper layer side data lines 6a formed on the upper layer side of the fourth interlayer insulating film 16 through a contact hole 34.

The upper layer side data lines 6a are formed of a light-shielding conductive material, for example, aluminum (Al) or the like, similarly to the lower layer side data lines 6b. The upper layer side data lines also shield light incident from the upper side (that is, an upper side of FIG. 7) of the TFT array substrate 10 so as to prevent the wirings, the elements or the like formed on the lower layer side of the upper layer side data lines 6a from being exposed to light. As a result, the TFT 30 may be mostly or completely shielded from returning light such as light emitted from another liquid crystal device and transmitted through a synthetic optical system in rear surface reflection of the TFT array substrate 10, a double plate type projector, or the like. Thus, it is possible to realize a high-quality image display. In the present embodiment, in particular, since the semiconductor layer 30a of the TFT 30 can be doubly shielded from light in conjunction with the upper layer side data lines 6a, it is possible to obtain an excellent light-shielding property.

Similarly to FIG. 6, the shield layer 8 is formed on the lower layer side of the upper layer side data lines 6a. The shield layer 8 is formed so as to suppress or prevent the upper layer side data line 6a from being coupled with the lower layer side data lines 6b formed on the lower layer side of the shield layer 8 with the third interlayer insulating film 15 (that is, disturbance of the image signal applied by an electric field generated by an electric potential difference between the upper layer side data lines 6a and the lower layer side data lines 6b) interposed therebetween.

The lower layer side data lines 6b are not electrically connected to the pixel corresponding to the even-numbered scanning lines 11 of the m scanning lines 11.

The other lamination structure of the pixel corresponding to the even-numbered scanning lines 11 of the m scanning lines 11 is equal to the lamination (see FIG. 6) of the pixel corresponding to the odd-numbered scanning lines 11 of the m scanning lines 11 (see FIGS. 5 and 6).

As described above, according to the electro-optical device according to the present embodiment, by doubly forming the data lines, it is possible to markedly improve writing efficiency to the pixel and to realize high quality of a display image.

Second Embodiment

Next, the structure of a liquid crystal device according to a second embodiment will be described with reference to FIG. 9. Since the liquid crystal device of the second embodiment has the schematic plan view, the cross-sectional view and the circuit diagram shown in FIGS. 1 to 4C in common with the first embodiment, the description thereof will be omitted and the planar structure and the lamination structure on the TFT array substrate 10 will be mainly described.

Figure 9:
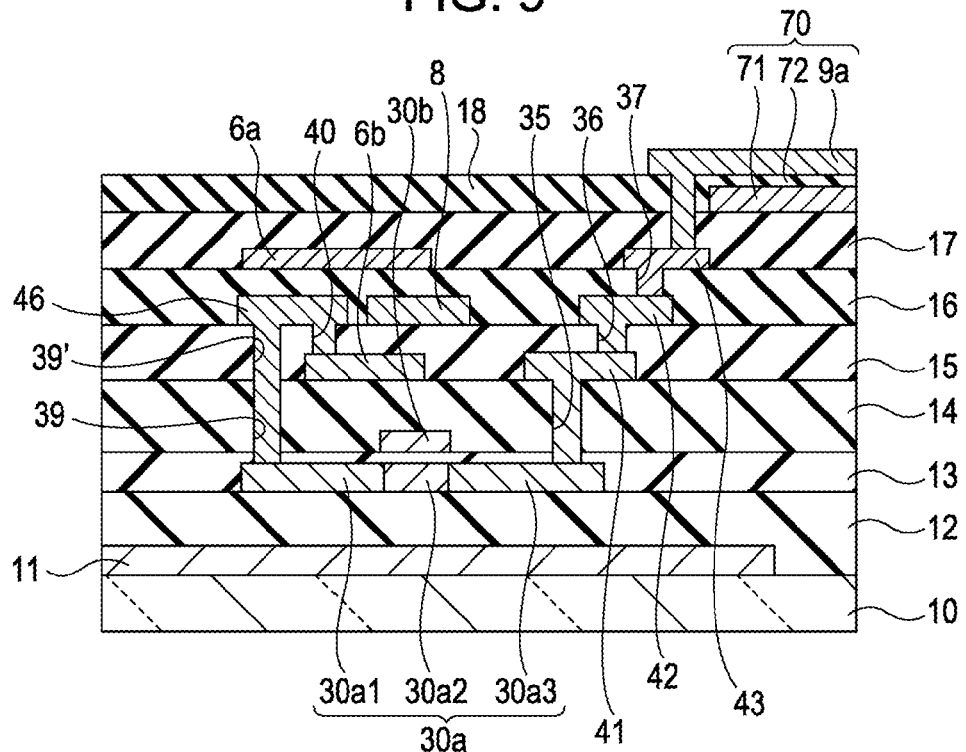
FIG. 9 is a cross-sectional view of an image display region corresponding to FIG. 6 in the liquid crystal device according to the second embodiment of the invention.
Figure 10:
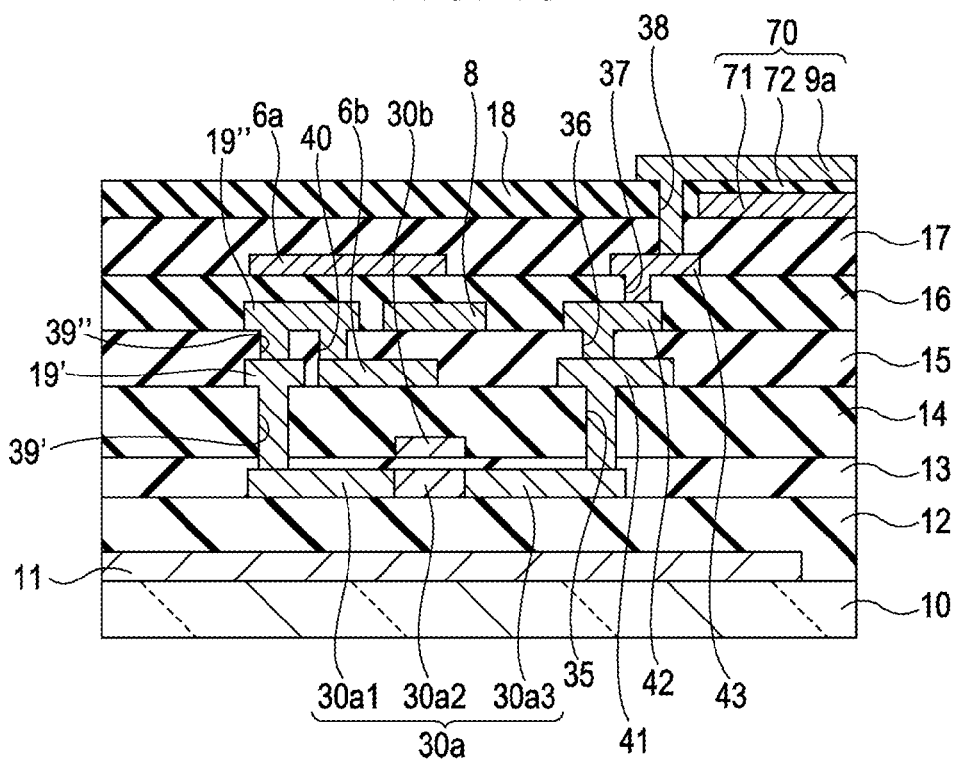
FIG. 10 is a cross-sectional view of an image display region corresponding to FIG. 6 in a liquid crystal device according to a third embodiment of the invention.

FIG. 9 is a cross-sectional view on the TFT array substrate corresponding to FIG. 6 of the first embodiment, in the present embodiment. In FIG. 9, the scale of each layer or each member is differentiated from each other in order that each layer or each member has a size capable of being identified in the view. In order to facilitate the understanding of the shown contents, a portion of the structure shown in FIGS. 9 and 10 is partially omitted.

The source region 30a1 is electrically connected to a sixth relay layer 46 formed on the upper layer side through a contact hole 39 formed in the gate insulating film 13, the second interlayer insulating film 14 and the third interlayer insulating film 15. The sixth relay layer 46 is electrically connected to the lower layer side data line 6b formed on the lower layer side through a contact hole 40 formed in the third interlayer insulating layer. That is, the present embodiment is different from the above-described first embodiment in that the source region 30a1 is electrically connected to the lower layer side data line 6b through the sixth relay layer 46.

Since the upper layer side data lines 6a are arranged at a position further from the source region 30a1 than the lower layer side data lines 6b, if an electrical connection is performed through a single contact hole, an electric resistance value between the upper layer side data lines 6a and the source region 30a1 is prone to be greater than an electric resistance value between the lower layer side data lines 6b and the source region 30b. If a difference in electric resistance value is present, a difference in supply timing or amplitude of the image signal is generated depending on which of the data lines 6 is connected to the source region 30a (that is, whether the data line connected to the source region 30a is the upper layer side data lines 6a or the lower layer side data lines 6b).

In the liquid crystal device according to the present embodiment, by intentionally connecting the lower layer side data lines 6b arranged at a position close to the TFT 30 to the source region 30a1 through the sixth relay layer 46, the electric resistance value between the lower layer side data lines 6b and the source region 30a1 is increased. As a result, the difference between the electric resistance value between the upper layer side data lines 6a the source region 30a1 and the electric resistance value between the lower layer side data lines 6b and the source region 30a1 can be reduced or solved.

Third Embodiment

Figure 11:
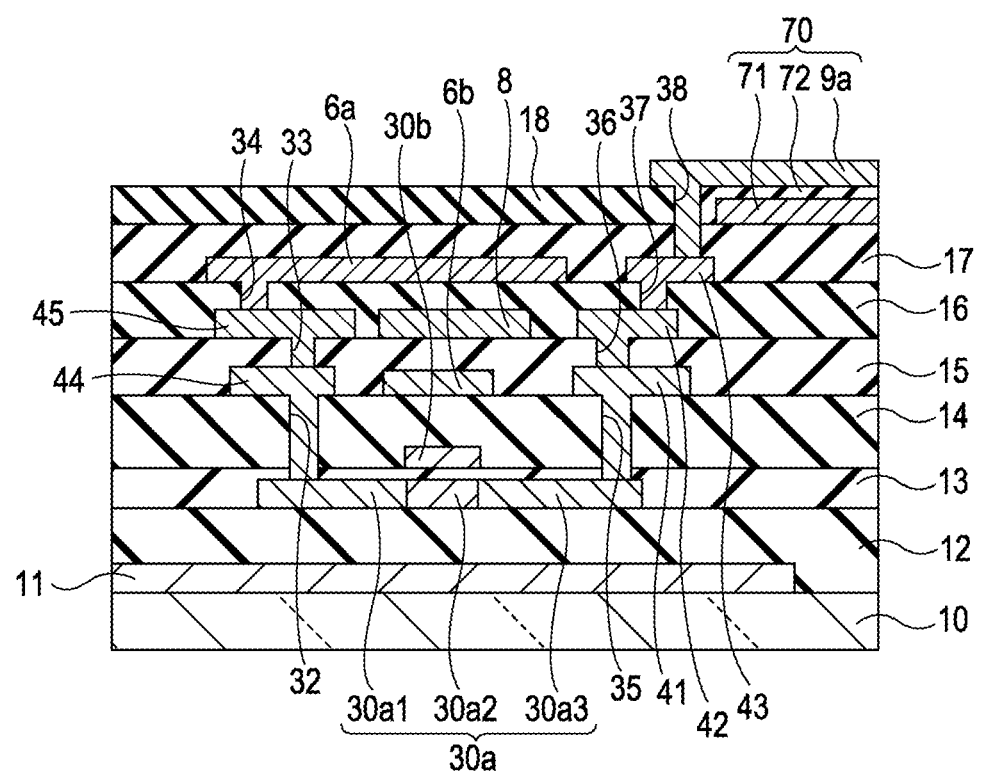
FIG. 11 is a cross-sectional view of an image display region corresponding to FIG. 7 in a liquid crystal device according to a third embodiment of the invention.

Next, the structure of a liquid crystal device according to a third embodiment will be described with reference to FIGS. 10 and 11. FIGS. 10 and 11 are a cross-sectional view on the TFT array substrate corresponding to FIGS. 6 and 7 of the first embodiment, in the present embodiment. Since the liquid crystal device of the third embodiment has the schematic plan view, the cross-sectional view and the circuit diagram shown in FIGS. 1 to 4C in common with the first embodiment, the description thereof will be omitted and the lamination structure on the TFT array substrate 10 will be mainly described.

First, the lamination structure of the pixel corresponding to the odd-numbered scanning line 11 of the m scanning lines 11 will be described with reference to FIG. 10.

The source region 30a1 is electrically connected to a seventh relay layer 19' formed on the upper layer side through a contact hole 39' formed in the gate insulating film 13 and the second interlayer insulating film 14. The seventh relay layer 19' is electrically connected to an eighth relay layer 19" formed on the upper layer side through a contact hole 39" formed in the third interlayer insulating layer 15. In addition, the eighth relay layer 19" is electrically connected to the lower layer side data line 6b formed on the lower layer side through a contact hole 40 formed in the third interlayer insulating film 15. That is, the present embodiment is different from the above-described second embodiment in that the relay layer for electrically connecting the source region 30*a*1 to the lower layer side data line 6*b* is divided into two steps.

Here, if the pixel electrode 9 and the drain region 30*a*3 are directly connected, since the film thickness of the insulating film (that is, the gate insulating film 13, the second interlayer insulating film 14 and the third interlayer insulating film) present between both layers is large, it is difficult to realize good electrical connection. That is, since the pixel electrode 9 and the drain region 30*a*3 are formed on the separated layers, if they are directly connected through one deep contact hole, a defect is generated in the contact hole originally having good conductivity in the manufacturing process thereof and thus the conductivity of the contact hole deteriorates. Accordingly, as in the present embodiment, by providing two relay layers (that is, the seventh relay layer 19' and the eighth relay layer 19"), it is possible to realize good electrical connection using the shallow contact holes (that is, the contact holes 39' and 39").

In the present embodiment, in particular, the contact holes 39' and 39" and the contact holes 35 and 36 are formed on the TFT array substrate 10 so as to be superposed on each other in plan view (that is, form a so-called stack contact structure). By arranging the position where the contact holes are formed as described above, it is possible to reduce the area of the non-opening region and to improve an aperture ratio of the image display region. As a result, it is possible to realize a liquid crystal device capable of displaying a bright sharp image.

Next, the lamination structure of the pixel corresponding to the even-numbered scanning line 11 of the m scanning lines 11 will be described with reference to FIG. 11.

In the lamination structure shown in FIG. 11, as compared with the lamination structure of the same portion of the first embodiment (see FIG. 7), the contact holes 32 and 33 and the contact holes 35 and 36 are formed on the TFT array substrate 10 so as to be superposed on each other in plan view (that is, form a so-called stack contact structure). As a result, as described with reference to FIG. 10, it is possible to reduce the area of the non-opening region and to improve an aperture ratio of the image display region.

Electronic Apparatus

Next, the case where the liquid crystal device which is the above-described electro-optical device is applied to various electronic apparatuses will be described.

Figure 12:
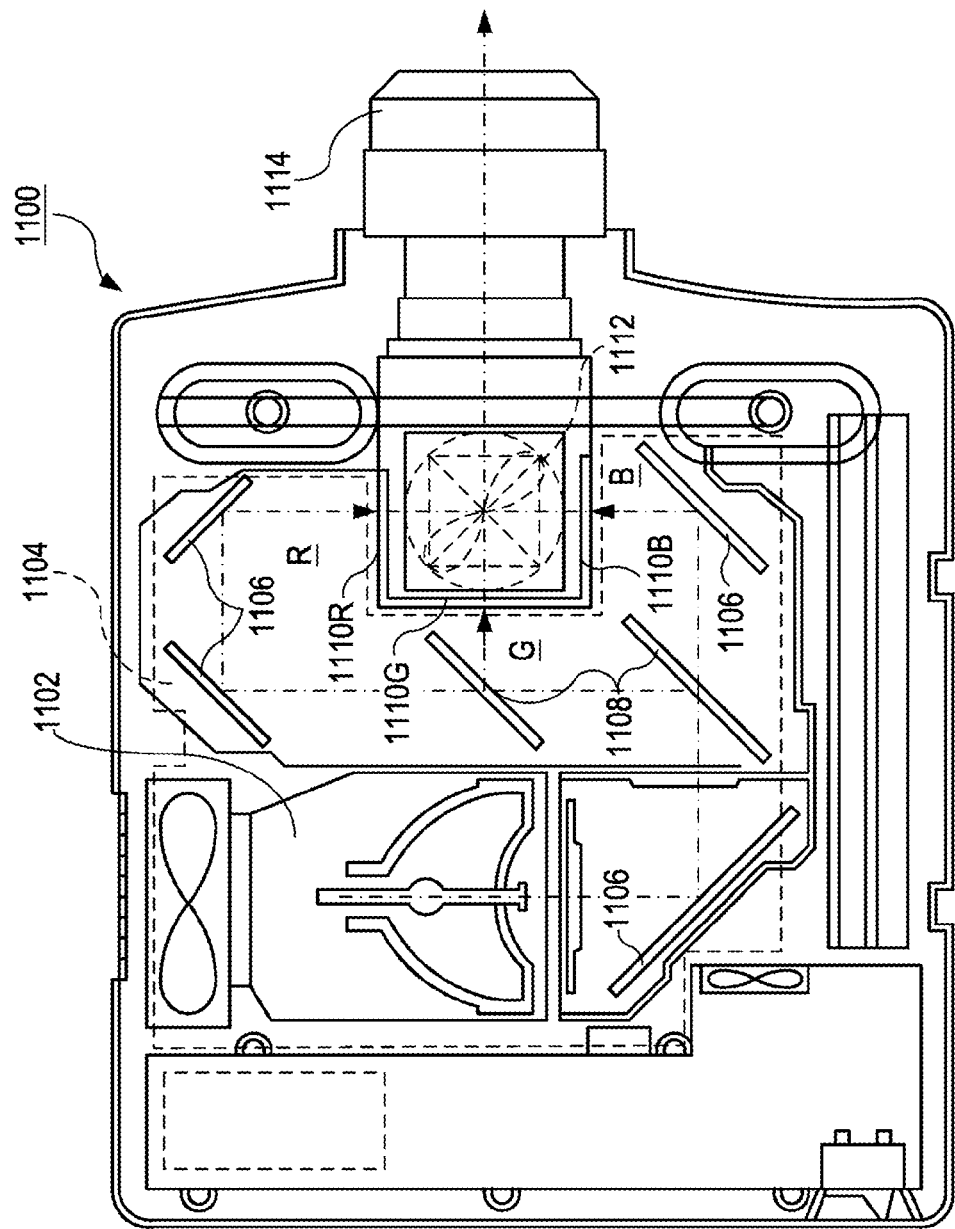
FIG. 12 is a plan view showing the configuration of a projector which is an example of an electronic apparatus including an electro-optical device.

FIG. 12 is a plan view showing the configuration example of a projector. Hereinafter, a projector, which uses the present liquid crystal device as a light valve, will be described.

As shown in FIG. 12, a lamp unit 1102 including a white light source such as a halogen lamp and the like is provided inside the projector 1100. A projected light emitted from the lamp unit 1102 is separated into three primary colors of R, G, and B by four mirrors 1106 and two dichroic mirrors 1108 disposed inside a light guide 1104 and the three primary colors are incident to the liquid crystal panels 1110R, 1110B, and 1110G as the light valves corresponding to each of the primary colors.

The configuration of each of the three liquid crystal panels 1110R, 1110B, and 1110G is equal to that of the above-described liquid crystal device, and the liquid crystal panels are driven by primary color signals of R, G, and B supplied from the image signal supply circuit. The light modulated by such liquid crystal panels is incident into a dichroic prism 1112 from three directions. In the dichroic prism 1112, the light of R and B is refracted at an angle of 90 degrees and the light of G goes straight. Therefore, an image of each color is synthesized, whereby a color image is projected onto a screen or the like through a projector lens 1114.

Here, when attention is focused on a display image by each of the liquid crystal panels 1110R, 1110B, and 1110G, the display image by the liquid crystal panel 1110G is needed to be horizontally mirror-inversed with respect to the display images by the liquid crystal panels 1110R and 1110B.

Further, since light corresponding to each of the primary colors R, G and B is incident to each of the liquid crystal panels 1110R, 1110B, and 1110G by the dichroic mirrors 1108, there is no need to provide a color filter.

In addition to the electronic apparatus described in FIG. 12, there are a mobile personal computer, a cellular phone, a liquid crystal television set, a viewfinder-type or direct-view monitor type video tape recorder, a car navigation system, a pager, an electronic organizer, an electronic calculator, a word processor, a workstation, a videophone, a POS terminal, a touch-panel-equipped device. In addition, the invention is applicable to various electronic apparatuses.

In addition, the invention may also be applied to a reflective liquid crystal device (LCOS), a plasma display panel (PDP), a field emission type display (FED, SED), an organic EL display, a digital micromirror device (DMD), an electrophoresis device, and the like, in addition to the liquid crystal device described in the above-mentioned embodiments.

The invention is not limited to the above-described embodiments and may be appropriately changed without departing from the scope of the invention as read from the claims and the overall specification and an electro-optical device having such changes and an electronic apparatus including the electro-optical device are included in the technical range of the invention.

The entire disclosure of Japanese Patent Application No. 2009-225301, filed Sep. 29, 2009 is expressly incorporated by reference herein.

What is claimed is:

1. An electro-optical device comprising:
    a first data line extending in a first direction;
    a second data line extending in the first direction, the second data line being arranged so as to be at least partially overlapped with the first data line in plan view;
    a first scanning line extending in a second direction intersecting the first direction;
    a second scanning line extending in the second direction;
    a first switching element that electrically connects to the first data line and the first scanning line; and
    a second switching element that electrically connects to the second data line and the second scanning line.

2. The electro-optical device according to claim 1, wherein, the first scanning line and the second scanning line are adjacent to each other.

3. The electro-optical device according to claim 1, further comprising:
    a shield layer being disposed between the first data line and the second data line, and
    the shield layer being held at a predetermined potential.

4. The electro-optical device according to claim 3, wherein,
    the shield layer has a portion that is wider than the first data line and the second data line in plan view.

5. An electronic apparatus comprising the electro-optical device according to claim 1.

6. The electro-optical device according claim 1, further comprising:
    scanning line driving circuits that electrically connect to the first scanning line and the second scanning line,
    wherein the scanning line driving circuits supply a scanning signal to the first scanning line and the second scanning line at the same timing.

7. The electro-optical device according claim 1, wherein, the first switching element has:
- a first source region that electrically connects to the first data line;
- a first gate electrode that electrically connects to the first scanning line; and
- a first drain region; and the second switching element has:
- a second source region that electrically connects to the second data line;
- a second gate electrode that electrically connects to the second scanning line; and
- a second drain region.

8. The electro-optical device according to claim 7, further comprising:
- a conductive layer being disposed on an upper layer side of the first data line,
- the conductive layer is electrically connected to the first source region through a first contact hole and is electrically connected to the first data line through a second contact hole such that the first source region is electrically connected to the first data line.

9. The electro-optical device according to claim 8, wherein,
- the conductive layer is electrically connected to the first source region through the first contact hole and a third contact hole, and
- the first contact hole and the third contact hole are at least partially superposed on each other in plan view.

10. The electro-optical device according to claim 7, wherein,
- the second data line is electrically connected to the second source region through a fourth contact hole and a fifth contact hole, and
- the fourth contact hole and the fifth contact hole are at least partially superposed on each other in plan view.

11. The electro-optical device according to claim 7, further comprising:
- a first pixel electrode electrically connected to the first drain region, and
- a second pixel electrode electrically connected to the second drain region.

12. The electro-optical device according to claim 11, wherein,
- the first pixel electrode is electrically connected to the first drain region through a sixth contact hole and a seventh contact hole,
- the sixth contact hole and the seventh contact hole are at least partially superposed on each other in plan view,
- the second pixel electrode is electrically connected to the second drain region through an eighth contact hole and a ninth contact hole, and
- the eighth contact hole and the ninth contact hole are at least partially superposed on each other in plan view.

13. The electro-optical device according to claim 11, further comprising:
- a first capacitive electrode formed on a lower layer side of the first pixel electrode with a first capacitive insulating film interposed therebetween; and
- a second capacitive electrode formed on a lower layer side of the second pixel electrode with a second capacitive insulating film interposed therebetween.

14. The electro-optical device according to claim 13, wherein,
- the first capacitive insulating film and the second capacitive insulating film are formed on the same layer, and
- the first capacitive electrode and the second capacitive electrode are formed on the same layer.

* * * * *